(12) United States Patent
Mok et al.

(10) Patent No.: US 7,309,151 B2
(45) Date of Patent: Dec. 18, 2007

(54) LIGHT EMITTING PANEL

(75) Inventors: Thye Linn Mok, Loveland, CO (US);
Siew Kim Tan, Loveland, CO (US);
Shin Wen Ng, Loveland, CO (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 303 days.

(21) Appl. No.: 11/103,172

(22) Filed: Apr. 11, 2005

(65) Prior Publication Data

US 2006/0227545 A1    Oct. 12, 2006

(51) Int. Cl.
*F21V 7/04*    (2006.01)
(52) U.S. Cl. ............... 362/560; 362/231; 362/555; 362/561; 362/582; 362/800
(58) Field of Classification Search ......... 362/231, 362/555, 560, 561, 582, 800
See application file for complete search history.

(56) References Cited

U.S. PATENT DOCUMENTS

2004/0233665 A1*  11/2004  West et al. ............. 362/245
2005/0007516 A1*  1/2005   Hong et al. ............ 349/64
2005/0052871 A1   3/2005   Leu et al.

FOREIGN PATENT DOCUMENTS

| DE | 102004030255 A1 | 1/2005 |
| EP | 1 179 858 A2 | 2/2002 |
| EP | 1 521 235 A3 | 6/2005 |

OTHER PUBLICATIONS

GE Advanced Materials, "Diffuser Films for Optical Displays", www.newmaterials.com, Mar. 17, 2004, 3 pages.
German Office Action dated Jan. 11, 2007 involving counterpart German Appl. No. 10 2005 057 446.7-51.
English translation of German Office Action dated Jan. 11, 2007 involving counterpart German Appl. No. 10 2005 057 446.7-51.

* cited by examiner

Primary Examiner—Stephen F Husar
Assistant Examiner—Meghan K. Dunwiddie

(57) ABSTRACT

In one embodiment, a light emitting panel includes a base panel and a plurality of light emitting elements mounted to the base panel. Each of the light emitting elements produces an illumination pattern having a region of substantially uniform intensity that extends over a radiation angle of at least about 60°. One or more light conditioners are positioned adjacent the base panel to receive and condition light produced by the light emitting elements.

19 Claims, 2 Drawing Sheets

LIGHT EMITTING PANEL

BACKGROUND

Light emitting panels are commonly used as backlights for display systems (e.g, liquid crystal displays), although they may be used for other purposes as well. Light emitting panels commonly used for backlighting displays include cold cathode florescent lamps (CCFL) and electro-luminescent panels. These types of light emitting panels are advantageous in that they provide substantially uniform illumination over the entire area of the panel, thus providing even illumination for the display. Unfortunately, however, CCFL and electro-luminescent panels are not without their disadvantages, including poor color rendition. In addition, they may involve the use of hazardous materials, such as mercury.

Partly in an effort to address the shortcomings of CCFL and electro-luminescent panels, light emitting panels have been developed that utilize light emitting diodes (LEDs) as the light sources. Besides being mercury-free, LED light emitting panels typically provide better color rendition than CCFL and electro-luminescent panels.

One type of LED light emitting panel is the edge-lit panel. In an edge-lit panel, a plurality of LEDs are positioned adjacent one or more of the edges of a light guide panel. Light from the LEDs enters the edges of the light guide panel and is re-directed within the light guide panel so that the light emerges from the front face of the light guide panel. A reflector may be provided on the back surface of the panel to reflect light toward the front surface of the panel that would otherwise exit from the back surface of the panel.

Unfortunately, edge-lit light emitting panels are not without their drawbacks. For example, the placement of the LEDs along the edges of an edge-lit panel limits the ability to dissipate heat produced by the LEDs. The edge-lit configuration also limits the maximum size of the panel, in that the number of LEDs that may be used to illuminate the panel increases linearly with the edge length, but the area that must be illuminated increases as the square of the edge length. Consequently, edge-lit panels are typically limited to panels having small areas.

Another type of LED light emitting panel is a so-called back-lit panel in which a plurality of LEDs are arranged in a two-dimensional array adjacent the back surface of the panel. The panel diffuses (i.e., evens-out) the light from the LEDs so that the panel appears to provide more even illumination than would be possible with just the LEDs alone. While back-lit panels do not suffer from the brightness limitations of edge-lit designs, and they may be used with panels having larger areas, it has proven difficult to effectively diffuse the light from the individual LEDs so that the panel appears to be evenly illuminated.

For example, one way to improve the illumination uniformity of a back-lit LED panel is to place the LEDs closer together. Disadvantageously, however, this increases the cost of the panel as more LEDs must be used. The closer spacing of the LEDs can also create heat dissipation problems. Another way to improve the illumination uniformity is to cause the panel to provide increased light diffusion. However, increased light diffusion typically represents a decrease in efficiency, thereby reducing the brightness of the panel or requiring the use of more or brighter LEDs to compensate for the efficiency loss associated with the increased diffusion.

SUMMARY OF THE INVENTION

In one embodiment, a light emitting panel comprises a base panel having a plurality of light emitting elements mounted thereon. Each of the light emitting elements produces an illumination pattern having a region of substantially uniform intensity that extends over a radiation angle of at least about 60°. One or more light conditioners are positioned adjacent the base panel to receive and condition light produced by the light emitting elements.

Other embodiments are also disclosed.

BRIEF DESCRIPTION OF THE DRAWINGS

Illustrative and presently preferred exemplary embodiments of the invention are shown in the drawings in which.

DETAILED DESCRIPTION

Figure 1:
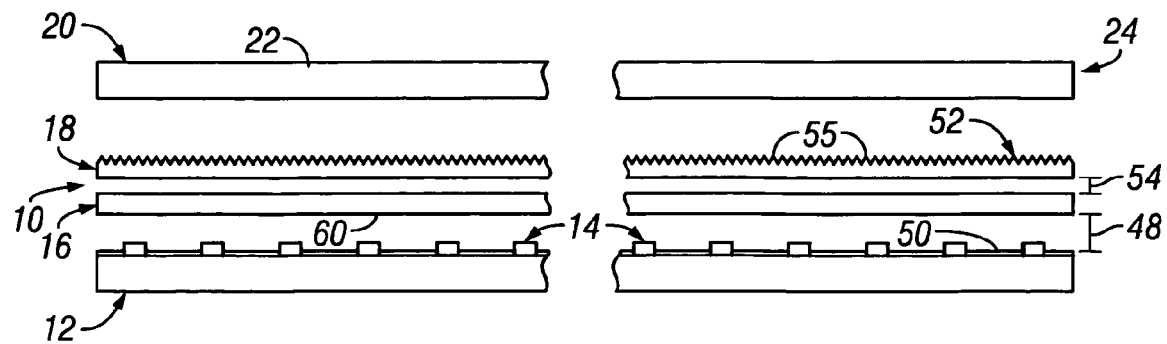
FIG. 1 is a side view in elevation of one embodiment of a light emitting panel.
Figure 2:
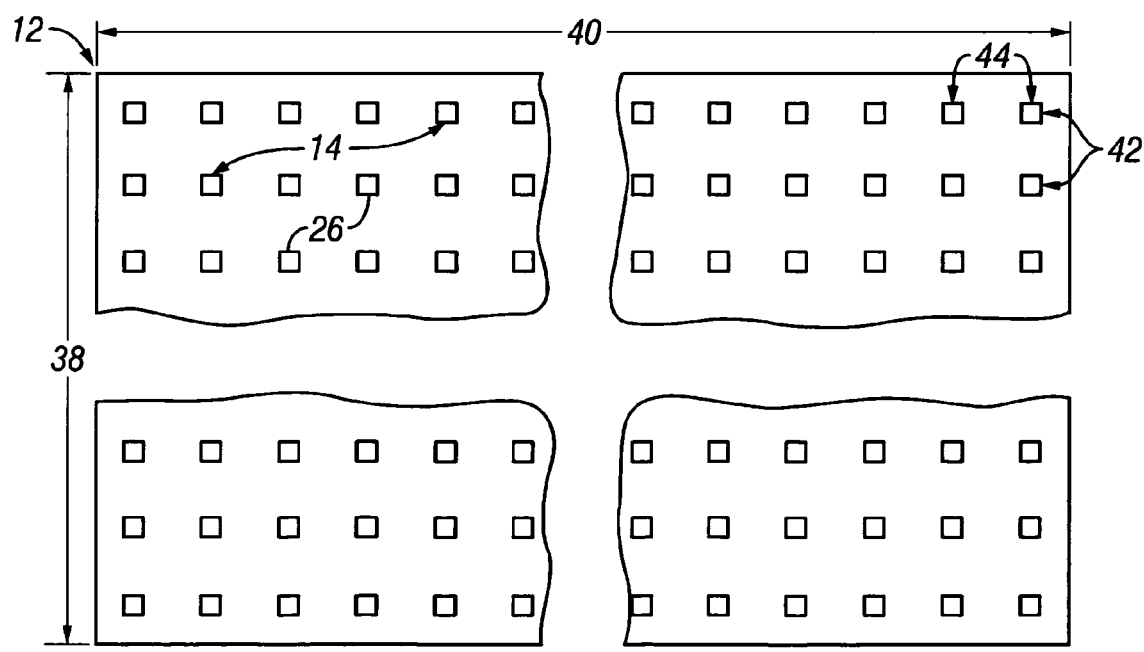
FIG. 2 is a plan view of a base panel having a plurality of light emitting elements mounted thereon.

An exemplary light emitting panel 10 is shown in FIGS. 1 and 2 and may comprise a base panel 12 having a plurality of light emitting elements 14 thereon. As will be described in greater detail below, each of the light emitting elements 14 produces an illumination pattern 46 that comprises a region 28 of substantially uniform intensity that extends over a large radiation angle (e.g., at least about 60°, and typically at least about 100°). See FIG. 4. One or more light conditioners 16, 18 are positioned adjacent the base panel to receive and condition light produced by the various light emitting elements 14. The light conditioners may comprise a diffuser 16 that is positioned adjacent the base panel 12 so that the diffuser 16 receives and diffuses light produced by the various light emitting elements 14 provided on the base panel 12, and a brightness enhancer 18 that is positioned adjacent the diffuser 16. The brightness enhancer 18 collects diffused light from the diffuser 16 and directs it out of a front surface 52 of the brightness enhancer 18 to maximize the on-axis brightness of the light emitting panel 10. In one application, the light emitting panel 10 may be positioned adjacent a display device 20, such as a liquid crystal display panel 22, to form a backlit display system 24.

Figure 3:
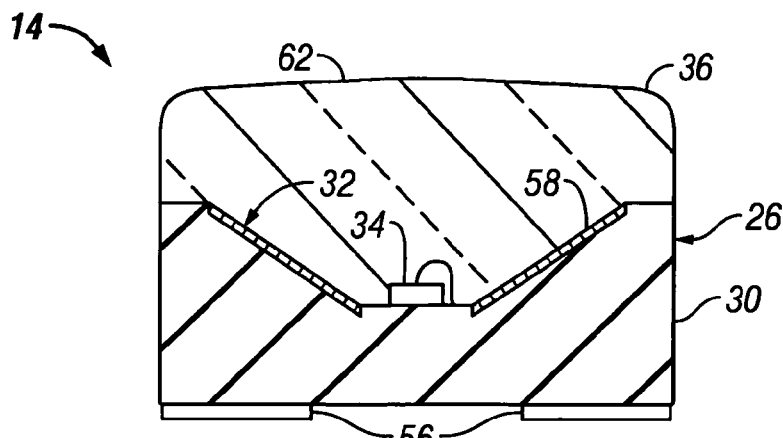
FIG. 3 a sectional view in elevation of one embodiment of a light emitting diode producing an illumination pattern comprising a region of substantially uniform intensity.
Figure 4:
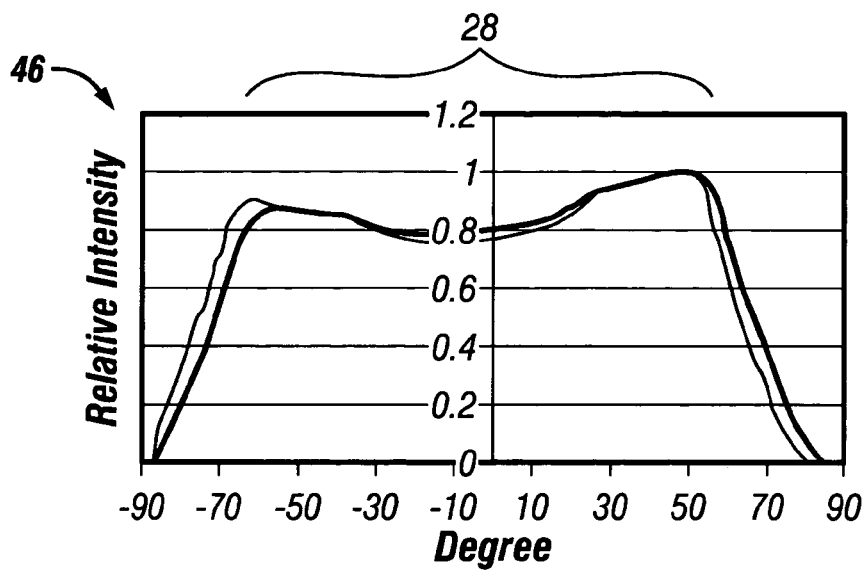
FIG. 4 is a graphical representation of the illumination pattern produced by the light emitting diode of FIG. 3.

Referring now to FIGS. 3 and 4, each light emitting element 14 may comprise a light emitting diode 26 that produces an illumination pattern 46 that includes a region 28 of substantially uniform intensity. The region 28 of substantially uniform intensity extends over a radiation angle of at least about 60° and typically over a radiation angle of at least about 100°. See FIG. 4. In the embodiment shown and described herein, the light emitting diode 26 may comprise a body or substrate 30 in which is formed a reflector cup 32. A light emitting diode junction 34 (i.e., a die) is positioned within the reflector cup 32. A lens 36 is then formed over the diode junction 34 and reflector cup 32 in the manner best seen in FIG. 3. The reflector cup 32 and lens 36 collect and direct light emitted by the diode junction 34 so that the light emitting diode 26 produces an illumination pattern 46 that comprises the region 28 of substantially uniform intensity, as illustrated in FIG. 4. The region 28 of substantially uniform intensity may also be referred to herein as a "flat topped radiation pattern," to distinguish it from a Lambertian radiation pattern, in which the intensity is proportional to the cosine of the emission angle relative to the normal. Lambertian radiation patterns are typically associated with conventional LEDs that emit light over high radiation angles (i.e., greater than about 100°).

In operation, the light emitting panel 10 produces a substantially uniform light output over its entire area, making it highly suitable for backlighting applications. The substantially uniform light output of the light emitting panel 10 is achieved without the need for closely-spaced light emitting diodes and without the need to utilize high-diffusivity diffusers. In addition, the light emitting panel 10 is not size-limited and is capable of providing high illuminations over large areas, making it ideal for use with large area displays, such as large screen computer and television displays.

Having briefly described one embodiment of a light emitting panel 10, various exemplary embodiments of the light emitting panel will now be described in detail. However, before proceeding with the description it should be noted that the light emitting panels disclosed herein may be utilized in any of a wide range of applications (e.g., as backlights for display devices) and to produce light having any of a wide range of spectral outputs (e.g., white light or colored light), as would become readily apparent to persons having ordinary skill in the art after having become familiar with the teachings provided herein.

Referring back now to FIG. 1, one embodiment of a light emitting panel 10 may comprise a base panel 12 suitable for receiving the various light emitting elements 14 in the manner described herein. The base panel 12 may comprise a generally rectangular shaped, plate-like member having a length 38 and a width 40 that are commensurate with the intended size of the panel 10. The base panel 12 provides a convenient mounting location for the various light emitting elements 14, allowing them to be arranged in a two dimensional array or pattern over both the length 38 and width 40 of the base panel 12. Because each of the light emitting elements needs to be electrically connected to a source of electrical power, it will be convenient in most applications for the base panel 12 to comprise a printed circuit board, although this is not required. In an embodiment wherein the base panel 12 comprises a printed circuit board, the light emitting elements 14 may be electrically connected (e.g., by soldering) to pads (not shown) provided on the base panel 12. The pads of the base panel 12 may then be connected to drive circuitry (not shown) suitable for providing the required electric current to the light emitting elements 14.

The various light emitting elements 14 may be mounted to the base panel 12 in any of a wide variety of configurations. In the embodiment shown and described herein, the light emitting elements 14 are arranged so that they define a plurality of rows 42 and columns 44. Alternatively, other configurations are possible.

A reflective surface 50 may be provided on the base panel 12 to "recycle" (i.e., reflect) light which may be reflected by the back surface 60 of diffuser 16 (i.e., light incident on the back surface 60 of the diffuser 16 at an angle that exceeds the critical angle for the particular diffuser 16). The reflective surface 50 may comprise a specular reflective surface (e.g., aluminum), or a diffuse reflective surface (e.g., white paint). The reflective surface 50 may comprise a separate component (e.g., a sheet-like material) that is affixed to the base panel 12. Alternatively, the reflective surface 50 may be deposited directly on the base panel 12 by any of a wide range of processes suitable for depositing the particular type of reflective material that is to be used.

The diffuser 16 is positioned in spaced-apart relation to the base panel 12 so that it receives and diffuses light produced by the light emitting elements 14 as well as light that my be reflected by the reflective surface 50 provided on base panel 12. In the embodiment shown and described herein, the diffuser 16 comprises a plastic diffuser film formed from a polycarbonate (e.g., Lexan®) plastic material, such as a plastic diffuser film available from GE Advanced Materials and sold under the trade mark "Illuminex" Alternately, other types of diffuser films made from other types of materials (e.g., polyethylene terephthalate (PET)) could also be used.

The diffuser 16 may be mounted in front of the base panel 12 and separated therefrom by a spaced-distance 48. Generally speaking, larger spaced-distances 48 will improve the uniformity of the light produced by the panel, but at the expense of panel thickness and some loss of efficiency. By way of example, in one embodiment, the diffuser 16 is separated from the base panel 12 by a distance 48 of about 50 millimeters (mm) or less.

The brightness enhancer 18 is positioned adjacent the diffuser 16 and receives diffused light therefrom. The brightness enhancer 18 comprises a plurality of optical elements, such as prisms 55 defined by the front surface 52 of the brightness enhancer 18, that collect light from the diffuser 16 and direct it out the front surface 52 of the brightness enhancer 18. The brightness enhancer 18 thereby maximizes the on-axis brightness of the panel 10. By way of example, in the embodiment shown and described herein, the brightness enhancer 18 comprises a brightness enhance film (BEF) available from 3M and sold under the registered trademark Vikuiti®Alternatively, other types of brightness enhancers could be used.

The brightness enhancer 18 may be mounted in front of the diffuser 16 and may be separated therefrom by a spaced-distance 54. However, the brightness enhancer 18 is preferably stacked directly on (or applied to) the diffuser 16, thereby minimizing or eliminating the distance 54.

Referring now to FIGS. 3 and 4, each light emitting element 14 may comprise a light emitting diode 26 that produces an illumination pattern 46 having a region 28 of substantially uniform intensity that extends over a large radiation angle of at least about 60° and more preferably over an angle of at least about 100°. See FIG. 4. In one embodiment, the light emitting diode 26 may comprise a base portion or substrate 30 in which is formed a reflector cup 32. The light emitting diode junction 34 or die is then positioned within the reflector cup 32.

The base portion or substrate 30 may be fabricated from various materials (e.g., plastics). The base portion 30 may also be provided with a suitable lead-frame or other electrically conductive structure for electrically connecting the light emitting diode junction 34 to pads or terminals 56 provided on the base portion 30.

The reflector cup 32 may be formed in the base portion 30 during fabrication thereof. Alternatively, the reflector cup 32 may be mechanically formed after fabrication of the base portion 30, such as, for example, by drilling. It is generally preferred that the reflector cup 32 be provided with a reflective coating 58 thereon to improve efficiency. By way of example, in one embodiment, the reflector cup 32 is initially plated with copper, then with a subsequent layer of gold or silver to maximize reflectivity.

A lens 36 is then formed over the diode junction 34 and reflector cup 32 in the manner best seen in FIG. 3. The lens 36 may comprise any of a wide range of transparent plastic materials and may be formed in accordance with any of a wide range of processes known in the art for providing lenses to LED packages. However, what is not conventional about the lens 36 is its shape. More specifically, the lens 36 and reflector cup 32 work together to re-direct light produced by the light emitting junction 34 so that the LED produces an illumination pattern 46 comprising the region 28 of substantially uniform intensity, as best seen in FIG. 4.

With reference now primarily to FIG. 4, the illumination pattern 46 may be characterized as a flat topped radiation pattern in that the region 28 of substantially uniform intensity extends over a wide radiation angle of at least about 60° and typically at least about 100°, before the illumination intensity drops below about 50% of the maximum illumination intensity produced by the light emitting element 14. Stated another way, the region 28 of substantially uniform intensity includes a minimum intensity value and a maximum intensity value, the minimum intensity value not being less than about 50% of the maximum intensity value. The flat-topped radiation pattern is achieved by the combination of the reflector cup 32 and the lens 36.

Figure 5:
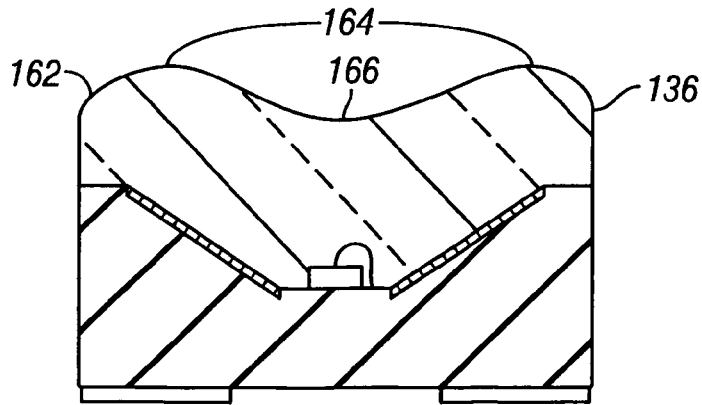
FIG. 5 is a sectional view in elevation of another embodiment of a light emitting diode producing an illumination pattern comprising a region of substantially uniform intensity.

A suitable design configuration for the reflector cup 32 and lens 36 may be developed by using any of a number of ray-tracing computer programs (e.g., ASAP Pro, available from Breault Research Organization, Inc., of Tucson, Ariz. 85715 (USA)) to model a proposed design. By way of example, in one embodiment, a generally conically-shaped reflector cup 32 and a lens 36 having a generally flat light output surface 62 (FIG. 3) will produce an illumination pattern 46 in which the region 28 of substantially uniform intensity extends over a radiation angle of at least about 100°. In another embodiment, illustrated in FIG. 5, the lens 136 may comprise a light output surface 162 having a convex portion 164 and a concave portion 166. Generally speaking, it will be preferred, but not required, to base the shape of the light output surface (e.g., 62 or 162) of the lens (e.g., 36 or 136) on a $3^{rd}$ order polynomial curve for ease of fabrication, although this is not required.

It is noted that regardless of the particular arrangement of the light emitting elements 14 on the base panel 12, the light emitting elements 14 should be spaced so as to maximize the uniformity of the light output of the panel 10. For example, the uniformity of the light output of the panel 10 can be maximized by considering the illumination pattern 46 (FIG. 4) produced by the light emitting elements 14, specifically the angle over which the illumination pattern 46 comprises the region 28 of substantially uniform intensity, as well as the distance 48 separating the base panel 12 and diffuser 16. That is, each of the light emitting elements 14 should be positioned sufficiently close to one another so that the regions 28 of substantially uniform intensity converge or merge together at about the same distance from the light emitting elements 14 as the distance 48 separating the base panel 12 and the diffuser 16. So spacing the various light emitting elements 14 will reduce the appearance of dark and light spots in the light emitting panel 10. Accordingly, in one embodiment wherein the region 28 of substantially uniform intensity extends over a radiation angle of about 100°, and wherein the distance 48 between the base panel 12 and the diffuser 16 is about 50 mm or less, a uniform illumination may be achieved by arranging the individual light emitting elements 14 so that they are spaced apart form one another by a distance of about 10-20 mm.

The light emitting elements 14 may be selected to provide any of a wide range of spectral outputs that may be desired for the particular light emitting panel 10. For example, several types of light emitting diodes have been developed that produce substantially white light. Therefore, a light emitting panel 10 that emits substantially white light may be produced in accordance with the teachings provided herein by utilizing white light emitting LEDs for the light emitting elements 14 (e.g., LEDs comprised of blue light emitters covered by phosphor coatings that convert their blue light to white light). Alternatively, white light-emitting panels may be produced by utilizing separate red, green, and blue LEDs for the light emitting elements 14, or by utilizing LEDs of other colors. Adjustments in the spectral output of the light emitting panel 10 may be accomplished by varying the numbers and placements of certain of the colors of the light emitting elements, as well as by variably driving the various colors of light emitting elements to increase or decrease their relative brightness.

The invention claimed is:

1. A light emitting panel, comprising:
   a base panel;
   a plurality of light emitting elements mounted to said base panel, each of said plurality of light emitting elements producing an illumination pattern having a region of substantially uniform intensity that extends over a radiation angle of at least about 60°; and
   one or more light conditioners to receive and condition light produced by said plurality of light emitting elements.

2. The light emitting panel of claim 1, wherein each of said plurality of light emitting elements comprises a light emitting diode.

3. The light emitting panel of claim 2, wherein each region of substantially uniform light intensity extends over a radiation angle of at least about 100°.

4. The light emitting panel of claim 2, wherein the light emitting diodes emit two or more different wavelengths of light.

5. The light emitting panel of claim 1, wherein said base panel comprises a printed circuit board, said printed circuit board electrically connecting each of said light emitting elements to a supply of electric current.

6. The light emitting panel of claim 1, further comprising a reflective surface provided on said base panel.

7. The light emitting panel of claim 1, wherein the light conditioners comprise:
   a diffuser positioned adjacent said base panel, said diffuser receiving and diffusing light produced by said plurality of light emitting elements; and
   a brightness enhancer positioned adjacent said diffuser to collect diffused light from said diffuser and direct light out of a front surface of the brightness enhancer.

8. The light emitting panel of claim 7, wherein said brightness enhancer comprises a sheet-like material defining a plurality of prisms.

9. A display system, comprising:
   a base panel;
   a plurality of light emitting elements mounted to said base panel, each of said plurality of light emitting elements producing an illumination pattern comprising a region of substantially uniform intensity that extends over a radiation angle of at least about 100°;

one or more light conditioners to receive and condition light produced by said plurality of light emitting elements; and a display device positioned adjacent said light conditioners.

10. The display system of claim 9, wherein the light conditioners comprise:

a diffuser positioned adjacent said base panel, said diffuser receiving and diffusing light produced by said plurality of light emitting elements; and a brightness enhancer positioned adjacent said diffuser, said brightness enhancer receiving diffused light from said diffuser.

11. The display system of claim 10, wherein said display device comprises a liquid crystal display panel.

12. A light emitting panel, comprising:

a base panel having a reflective surface provided thereon;

a plurality of light emitting elements mounted to said base panel, each of said plurality of light emitting elements producing an illumination pattern that comprises a region of substantially uniform intensity that extends over a radiation angle of at least about 100°;

diffuser means positioned adjacent said base panel for diffusing light produced by said plurality of light emitting elements; and brightness enhancing means positioned adjacent said diffuser means for enhancing the brightness of diffused light from said diffuser means.

13. The light emitting panel of claim 12, wherein each of said plurality of light emitting elements comprises a light emitting diode.

14. A light emitting panel, comprising:

a base panel;

a plurality of light emitting elements mounted to said base panel, each of said plurality of light emitting elements comprising a light emitting diode which produces an illumination pattern having a region of substantially uniform intensity that extends over a radiation angle of at least about 100°, said light emitting diode comprising a reflector cup, a light emitting junction mounted within said reflector cup, and a lens positioned over said reflector cup and said light emitting junction; and one or more light conditioners to receive and condition light produced by said plurality of light emitting elements.

15. The light emitting panel of claim 14, wherein said lens comprises a substantially flat light output surface.

16. The light emitting panel of claim 14, wherein said lens comprises a light output surface comprising a convex portion and a concave portion.

17. A light emitting panel, comprising:

a base panel;

a plurality of light emitting elements mounted to said base panel, each of said plurality of light emitting elements producing an illumination pattern having a region of substantially uniform intensity that extends over a radiation angle of at least about 60°, said region of substantially uniform intensity further comprising a minimum intensity and a maximum intensity, the minimum intensity not being less than about 50% of the maximum intensity; and one or more light conditioners to receive and condition light produced by said plurality of light emitting elements.

18. A light emitting panel, comprising:

a base panel;

a plurality of light emitting elements mounted to said base panel, each of said plurality of light emitting elements producing an illumination pattern having a region of substantially uniform intensity that extends over a radiation angle of at least about 60°;

one or more light conditioners to receive and condition light produced by said plurality of light emitting elements; and a reflective surface provided on said base panel, said reflective surface comprising a specular reflective surface.

19. A light emitting panel, comprising:

a base panel;

a plurality of light emitting elements mounted to said base panel, each of said plurality of light emitting elements producing an illumination pattern having a region of substantially uniform intensity that extends over a radiation angle of at least about 60°;

one or more light conditioners to receive and condition light produced by said plurality of light emitting elements; and a reflective surface provided on said base panel, said reflective surface comprising a diffuse reflective surface.

* * * * *